United States Patent [19]

Dorbeck

[11] 4,198,955
[45] Apr. 22, 1980

[54] SOLAR ENERGY COLLECTION SYSTEM

[75] Inventor: Leo R. Dorbeck, Campbellville, Canada

[73] Assignee: Canadian Sun Systems Ltd., Campbellville, Canada

[21] Appl. No.: 902,381

[22] Filed: May 3, 1978

Related U.S. Application Data

[63] Continuation-in-part of Ser. No. 850,154, Nov. 10, 1977.

[30] Foreign Application Priority Data

Nov. 15, 1976 [GB] United Kingdom ............... 47564/76
Mar. 30, 1977 [CA] Canada ................................ 275382

[51] Int. Cl.$^2$ ............................................... F24J 3/02
[52] U.S. Cl. ..................... 126/439; 126/438; 126/443; 350/293
[58] Field of Search ............... 126/270, 271, 438, 443, 126/448, 439; 237/1 A; 136/89 DC; 350/288, 293, 296

[56] References Cited

U.S. PATENT DOCUMENTS

| | | | |
|---|---|---|---|
| 3,227,153 | 1/1966 | Godel et al. | 126/271 |
| 3,952,724 | 4/1976 | Pei | 126/271 |
| 3,990,914 | 11/1976 | Weinstein et al. | 126/271 |
| 4,033,327 | 7/1977 | Pei | 165/142 |
| 4,092,979 | 6/1978 | Kotlarz | 126/271 |
| 4,120,285 | 10/1978 | Nugent | 126/271 |
| 4,129,115 | 12/1978 | Wyatt | 126/438 |
| 4,134,392 | 1/1979 | Livermore et al. | 126/439 |

Primary Examiner—James C. Yeung
Assistant Examiner—Larry Jones
Attorney, Agent, or Firm—Sim & McBurney

[57] ABSTRACT

An efficient solar collector includes an outer evacuated envelope having an upper transparent surface to admit light rays to the envelope and a tube extending in the envelope from one end towards the other for conveying fluid to be heated into the collector and for removing heated fluid from the collector. A selectively absorbing surface is provided on the tube for selectively absorbing energy having predetermined wavelengths and rejecting other wavelengths. An elongate reflector having a particular locus is located internally of the light and arranged to reflect light received through the transparent surface onto the tube at a concentration ratio which is the ratio of the transverse width of the upper transparent surface to the outer circumference of the tube. The locus of the reflector surface is the shape required to ensure that all incident rays received through the upper transparent surface within the acceptance angle $\theta$ determined by the equation $C = 1/\sin \theta$ where C is the concentration ratio are concentrated on the tube while rays outside the acceptance angle are reflected. The collector may be used in a solar energy collection system with any convenient space heating or cooling system. A solar collection system utilizing a series of modular collectors is described.

27 Claims, 21 Drawing Figures

SOLAR ENERGY COLLECTION SYSTEM

REFERENCE TO RELATED APPLICATION

This application is a continuation-in-part of my earlier filed U.S. patent application Ser. No. 850,154 filed Nov. 10, 1977.

FIELD OF INVENTION

This invention relates to a solar energy collection system.

BACKGROUND TO THE INVENTION

With the increasing cost of conventional fuel and energy for heating and cooling, much attention has been directed to the possibility of the use of sunlight as a source of energy for heating and cooling. Many systems have been proposed, but none has been commercially successful due to high costs and inefficient energy collection.

SUMMARY OF THE INVENTION

The present invention provides a highly efficient collector which is readily made and is structured of inexpensive materials. Manifold structures also are provided for the transportation of fluid to be heated and heated fluid.

In accordance with the present invention, there is provided a solar collector, comprising an outer evacuated elongate envelope having an upper transparent surface to admit light rays to the envelope; a tube extending in the envelope from one end thereof towards the other for conveying fluid to be heated into the collector and for removing heated fluid from the collector; a selectively absorbing surface on the tube for selctively absorbing energy having predetermined wavelengths and rejecting other wavelengths; and an elongate reflector surface located internally of the envelope and arranged to reflect light received through the transparent surface onto the tube; the upper transparent surface and the tube being dimensioned to provide a concentration ratio which is the ratio of the transverse width of the upper transparent surface to the outer circumference of the tube; the locus of the reflector surface being the shape required to ensure that no less than about 75% of the maximum efficiency of the collector is realized, the maximum efficiency being provided by the shape required to ensure that all incident rays received into the envelope through the upper transparent surface within the acceptance angle determined by the equation: $C=1/\sin\theta$ where C is the concentration ratio and $\theta$ is the acceptance angle, are concentrated on the tube while rays outside the acceptance angle are reflected.

A collector constructed in this manner is highly efficient as a result of the evacuation of the envelope, the selective absorbing coating and the shape of the reflecting surface and is able to collect solar heat without the necessity of tracking, although tracking may be employed, if desired. The collector may be used with any desired fluid, such as, air or water.

The collector of this invention may be incorporated into a solar energy collection system, comprising an elongate manifold through which flows fluid to be heated and heated fluid and a plurality of pairs of the solar collectors extending one from each side of the manifold generally perpendicular thereto.

DESCRIPTION OF PREFERRED EMBODIMENT

Figure 1:
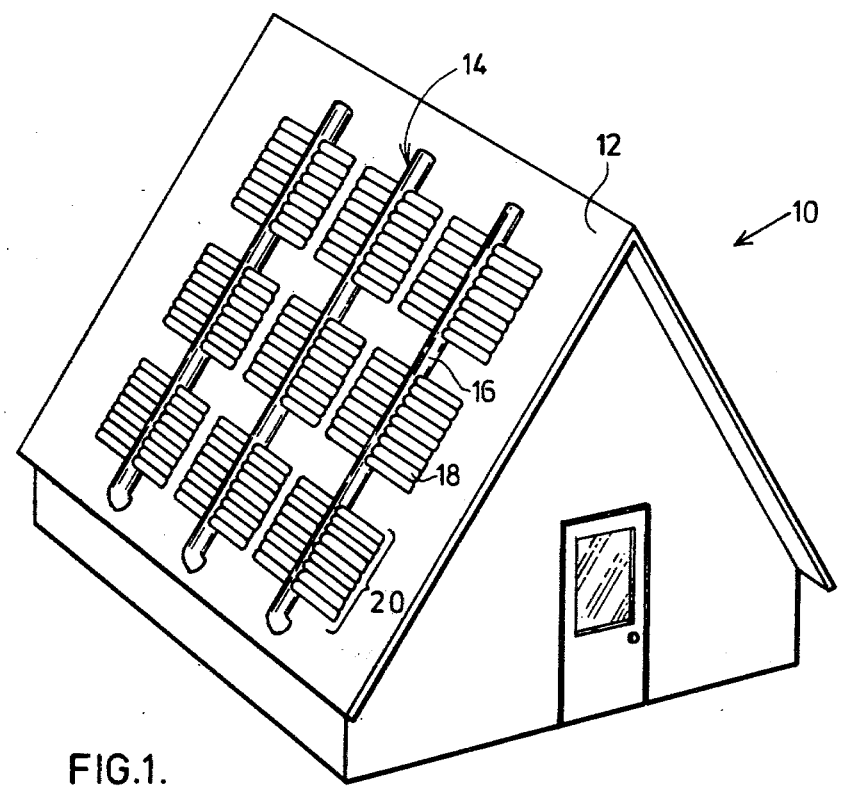
FIG. 1 is a perspective view of a structure including a solar energy collection system constructed in accordance with the present invention and having banks of solar heat collectors.

Referring first to FIG. 1 of the drawings, a building structure 10 is provided having sloping roof panels 12, one only of the panels supporting banks of solar collectors 14 with their associated manifold. The building structure 10 may be a dwelling or may be a structure separate from a dwelling to be heated or cooled by collected solar energy.

The angle of elevation of the roof panel 12 having the banks 14 of solar collectors thereon with respect to a horizontal ground is chosen to achieve maximum incidence of sun rays on the banks 14 of collectors and typically is about 10° greater than the angle of latitude of location of the building 10. In an alternative arrangement, the roof panels 12 may be constructed to be movable relative to each other to maintain a high incidence of sun rays during daylight hours in different seasons.

Similarly, the orientation of the building 10 is predetermined to achieve optimum incidence of sun rays, and generally is due south.

Each bank 14 of collectors includes a central manifold 16 extending perpendicularly to the roof apex and a plurality of pairs of collectors 18 extending one on each side of the manifold 16 generally perpendicular thereto. For ease of construction, repair and replacement, the banks 14 are formed of interconnected units, with each unit 20 comprising a manifold portion constructed to be joined to other like manifold portions and a number of pairs of the collectors 18.

As illustrated, the number of pairs in each unit 20 is nine, but this is a convenient number which may be altered, as desired.

While three banks 14 of collectors are illustrated associated with each roof panel 12, this is for ease of illustration, and any desired number of such banks may be used, depending on individual dimensions of the banks and the area of supporting structure available.

Figure 2:
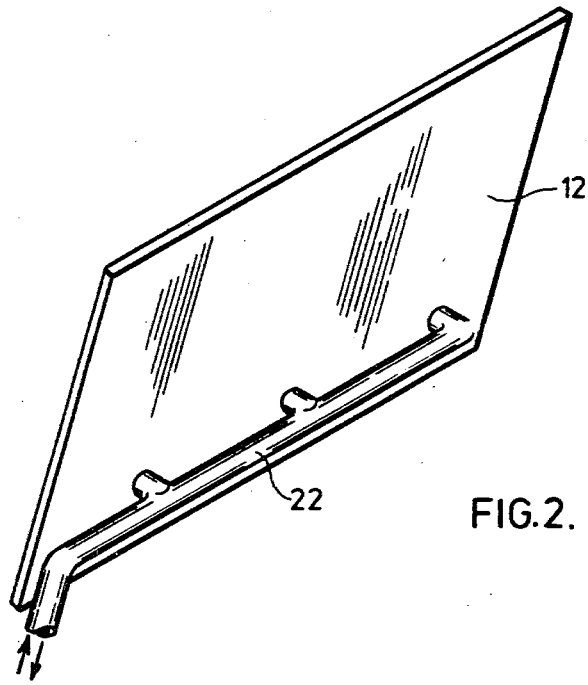
FIG. 2 is a view of the underside of one of the roof panels illustrating the piping to the panels.

FIG. 2 illustrates a typical arrangement of manifolding beneath the roof panel 12, wherein a two conduit fluid conveying pipe 22 communicates with the inlets and outlets of the three banks 14 in parallel.

The fluid conveying pipe 22 communicates directly or indirectly a suitable thermal storage device, which in turn, communicate with a space heating or cooling system, as desired. Any other convenient fluid supply and return means for the banks 14 may be adopted. The fluid conveniently is water, although air or other heat retaining fluid may be used.

Figure 3:
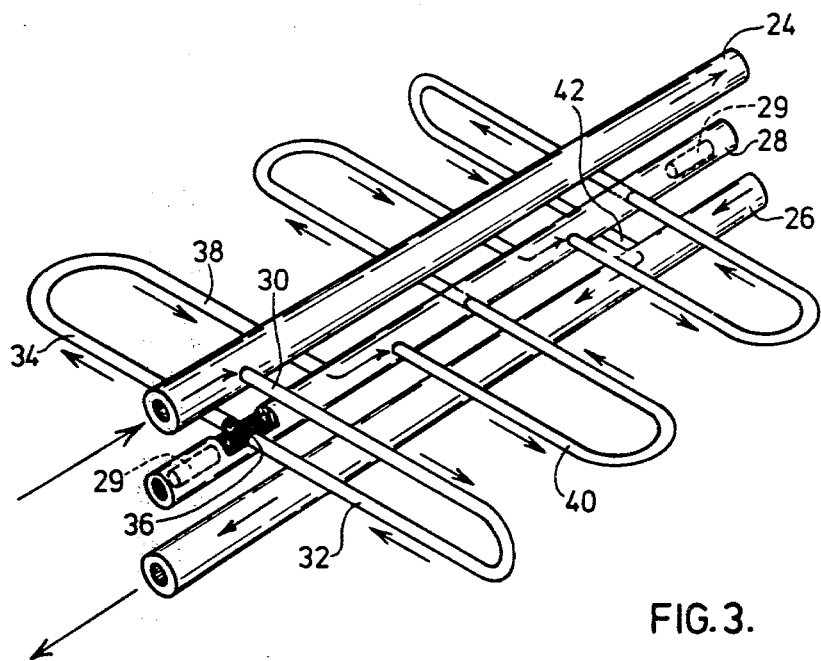
FIG. 3 is a schematic view of the flow channels and flow paths of fluid through an individual group of solar collectors.

In FIG. 3, there is shown schematically the arrangement of one group of fluid flow pipes in the manifold 16 and their interconnection with the individual collectors 18. Several such groups are present in each bank 14. As seen therein, there is an upper fluid inflow pipe 24 and a lower parallel fluid outflow pipe 26. The utilities of the pipes may be reversed, if desired. A central flow pipe 28 extends between the upper and lower pipes 24 and 26 in parallel relation thereto and is closed by plugs 29.

The upper inflow pipe 24 communicates at intervals along its length with the inflow pipe 30 of an individual collector 18. Fluid thereby is diverted from the inflow pipe 24 to a collector 18. The fluid outflow pipe 32 of the first collector 18 communicates with the inflow pipe 34 of the collector 18 on the opposite side of the manifold 16. The communication occurs through a connector 36 provided in the central pipe 28, which also serves to prevent fluid flow along the central pipe 28 past the connector 36.

The outflow pipe 38 from the second collector 18 communicates with the central pipe 28, which then feeds the inlet pipe 40 of a third collector 18. The arrangement is repeated until the outlet pipe 42 from the last collector communicates with the outlet pipe 26.

In this way, fluid to be heated is fed in parallel manner to and collected in parallel manner from a plurality of sets of individual collectors 18, the fluid flowing in series through the individual collectors 18 in each of the sets.

The number of individual collectors 18 in each series-connected set depends on the size of the collectors 18, the flow rate therethrough and the temperature rise desired in the set.

Figure 5:
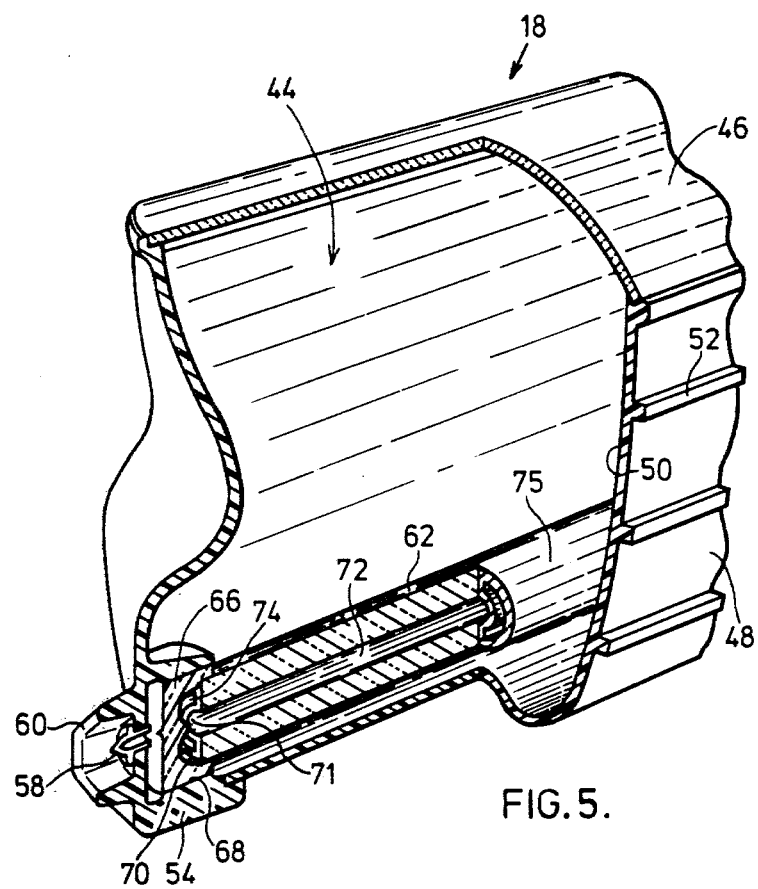
FIG. 5 is a perspective part sectional view of the other end of the solar collector of FIG. 4.
Figure 4:
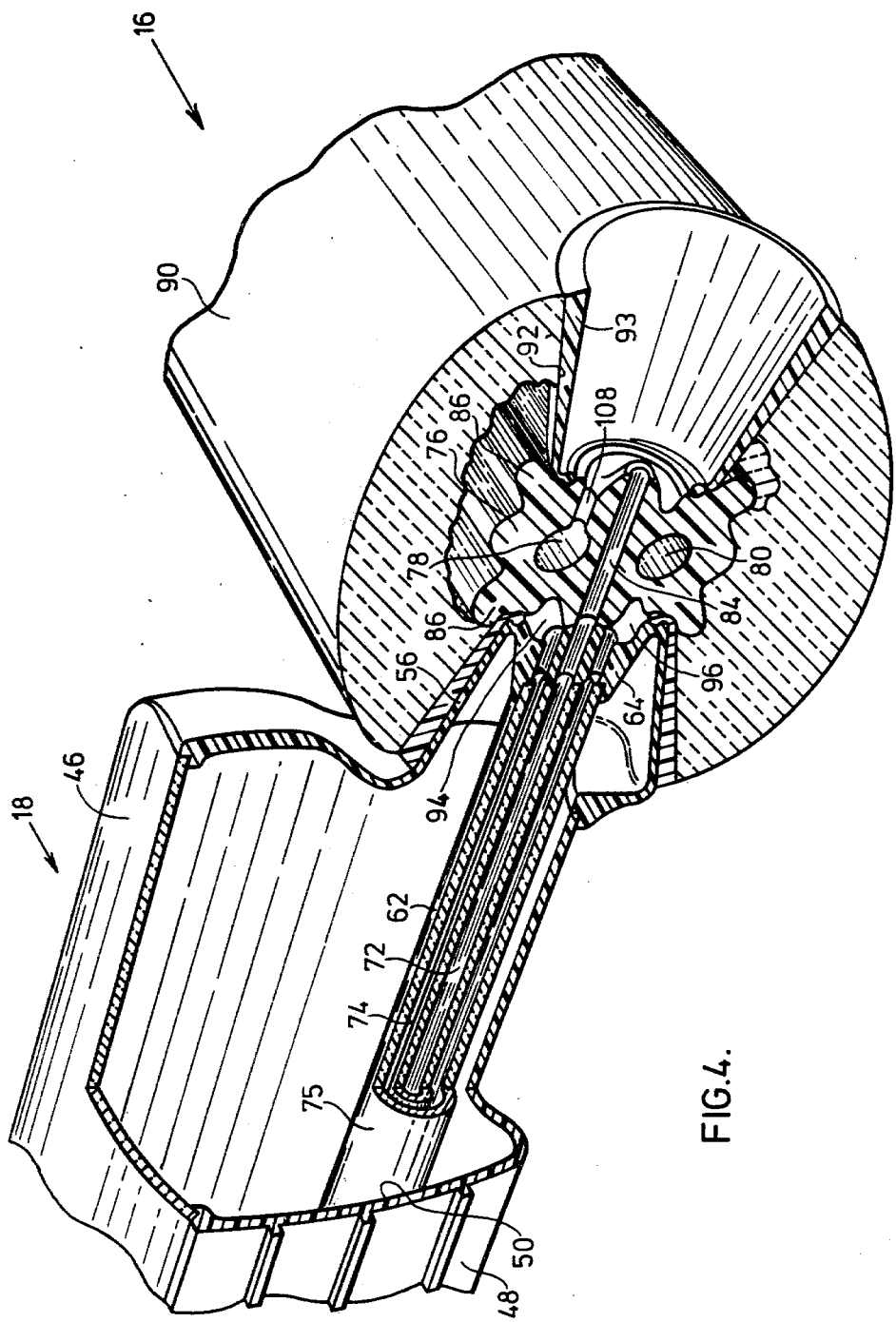
FIG. 4 is a part vertical sectional perspective view of one end of a solar collector and associated manifold in accordance with one embodiment of the invention.
Figure 6:
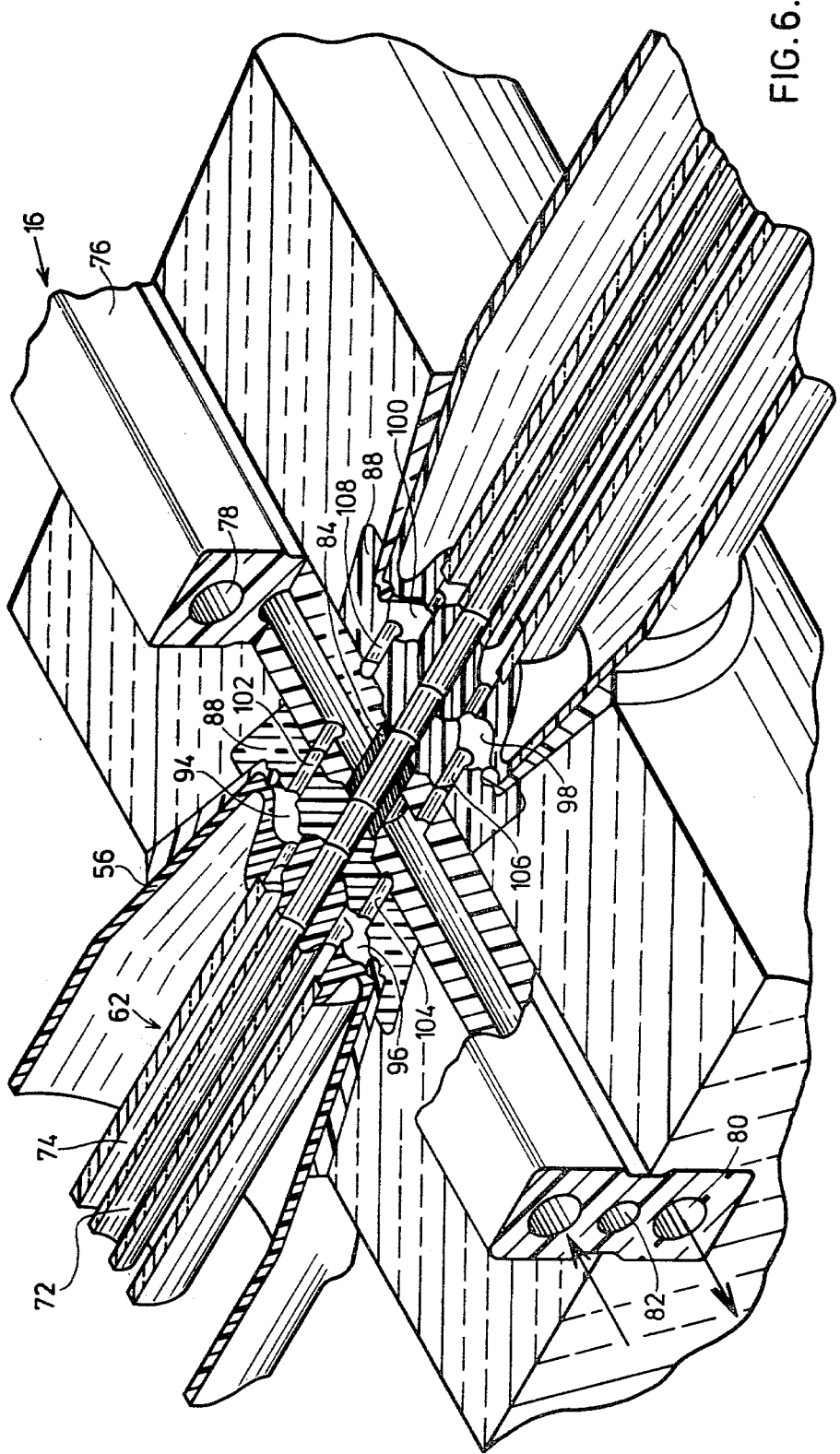
FIG. 6 is a part horizontal sectional view of the view shown in FIG. 4 and including a modified manifold structure.

Referring now to FIGS. 4 to 6, there is illustrated therein one embodiment of a solar collector 18 provided in accordance with one embodiment of this invention and two alternative forms of a manifold 16 in accordance with one embodiment of the invention.

A solar collector 18 comprises an evacuated elongate envelope 44 having a transparent cover member 46, usually formed of glass, sealingly joined to a lower body enclosure 48.

The body enclosure 48 has a precise cross-sectional shape, as discussed in more detail below, and is provided on the inner surface with a layer or coating of reflective material 50, such as, silver.

The body enclosure 48 preferably is formed of a vitreous ceramic material formed from clay and various fluxes. Vitreous ceramic materials are inexpensive, readily available and can be formed into shaped objects by molding or extrusion, making them ideal for the formation of the body enclosure 48.

The outer surface of the body enclosure 48 has a plurality of longitudinally-extending reinforcing ribs 52. The lower surface of the envelope 44 is provided with flattened areas, such as at 54, to enable the collector 18 to be supported from below by the roof panel 12.

At one end of the evacuated envelope 44, the collector 18 tapers to a conical nose 56 which is received in a complimentarily-shaped opening in the manifold 16, as described in more detail below. At the other end of the evacuated envelope 44 is an end closure having a vacuum seal 58 through which the enclosure 44 is originally evacuated and a gripping aid axial projection 60 to assist in assembly of the collector 18 in the manifold 16.

Located within the evacuated envelope 44 and extending axially the length thereof is a tube 62. The tube 62 is mounted at one end in a collar 64 projecting inwardly from the mouth of the cone 56 and at the other end in an end cap 66 slidably mounted in a recess 68 formed in the body enclosure 48 adjacent the vacuum seal 58.

The insert 66 has a depression 70 formed therein opposite the end of the tube 62 to define a chamber 71 therewith. The tube 62 is comprised of inner and outer flow channels 72 and 74 respectively, in communication with each other through the chamber 71. The insert 66 is formed of transparent material, such as, glass, so that fluid flow through the chamber 71 from the tube 62 may be observed.

The flow channels 72 and 74 may be defined by inner and outer concentric tube members, as shown in FIG. 4, or by passageways formed in a single tube member, as shown in FIG. 5. Fluid to be heated flows into the collector 18 through one of the flow channels 72 and 74 and out of the collector 18 through the other of the flow channels 72 and 74. During passage of fluid through the tube 62, the fluid is heated, by collected sunlight, as described in more detail below.

The outer surface of the tube 62 has a coating layer 75 thereon of a material, such as, chrome black, which selectively absorbs energy of a certain wavelength, generally about $3 \times 10^{-7}$ to about $3 \times 10^{-6}$ meters, while not absorbing other wavelengths. The use of a selectively absorbent material coating 75 in this way minimizes heat losses from the tube 62 through radiation.

Alternatively, at least the outer wall of the tube 62 may be formed of a material which will act as a selective absorber, such as, a black ceramic material.

The manifold 16 includes a central elongate member 76 which has vertically-aligned elongate parallel bores 78, 80 and 82 therein corresponding to the pipes 24, 26 and 28 shown in FIG. 3. The central elongate member preferably is formed of a vitreous ceramic material for the same reasons given above in connection with the preferred material of construction of the body enclosure 48. A transversely located tubular connector 84 is positioned transversely of the bore 82 and establishes communication between the pipes 72 of opposite pairs of collectors 18 to establish a flow path therebetween equivalent to connector 36 in FIG. 3.

The central member 76 is shown in two different forms in FIGS. 4 and 6. In FIG. 4, the central member 76 also including integral projections 86 while separate projections 88 are provided in the embodiment of FIG. 6. The central member 76 in both cases is surrounded by insulation material 90, which may be foamed plastic material. An outer protective metal layer may be provided.

The insulation 90 has horizontally-opposed conical openings 92 formed in opposite sides thereof to receive the conical ends 56 of the collectors 18 therein. Seals 93 of vinyl rubber or the like are provided in the conical openings 92 to seal the conical ends 56 of collectors 18 in position in the manifold 16.

The integral projections 86 or separate projections 88 define with the adjacent ends of the collars 64 a plurality of cavities 94, 96, 98 and 100 which define in conjunction with associated bores 102, 104, 106 and 108 respectively formed in the projections 86 or 88 and the central member 76, selective flow channels for flow of fluid into and out of the collectors 18 and through the manifolding in accordance with the schematic representation of FIG. 3.

Figure 7:
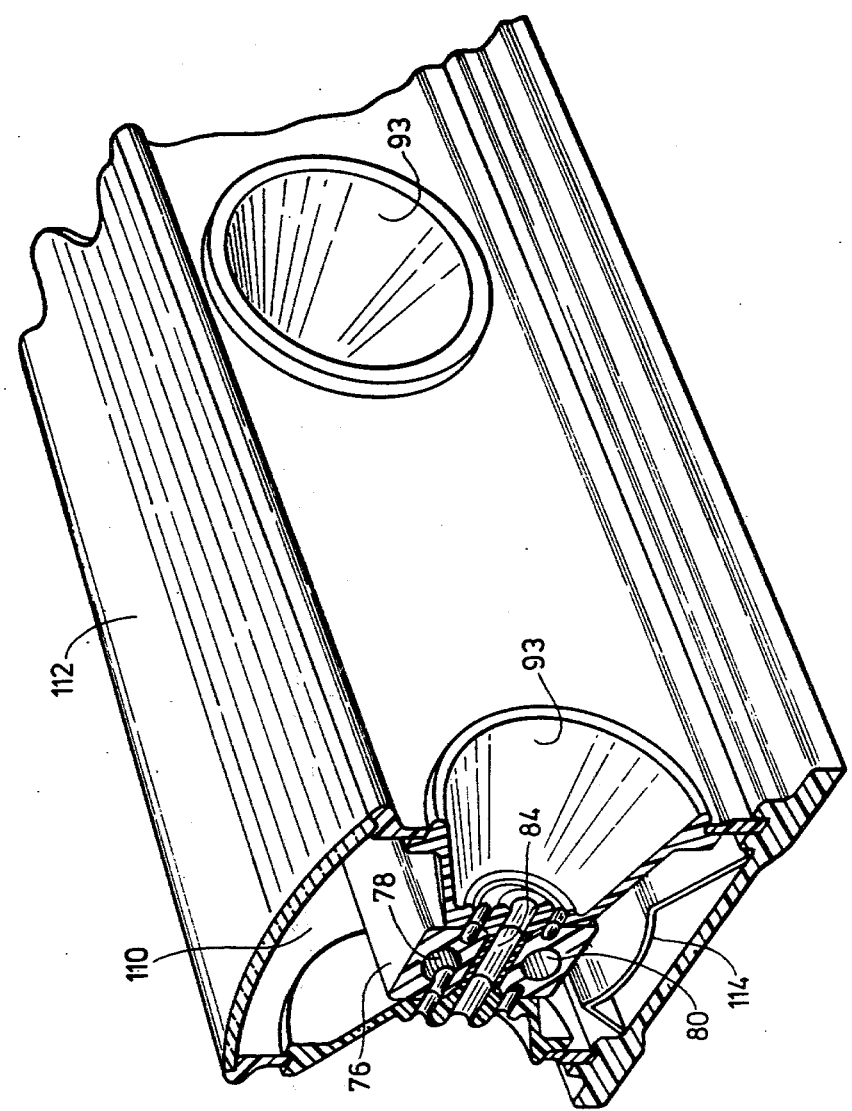
FIG. 7 is a perspective and sectional view of an alternative manifold structure.

Turning now to the embodiment of FIG. 7, there is shown therein an alternative form of manifold 16. In this embodiment, the central elongate member 76 is suspended in a vacuum sealed box-like chamber 110 having a transparent cover 112 formed of glass or the like. Located in the chamber 110 is a reflector 114 which concentrates solar energy received through the cover 112 on the central member 76 to heat fluid flowing therethrough, and thereby eliminate heat losses from the manifold 16 and even achieve heating of fluid in the manifold.

Figure 8:
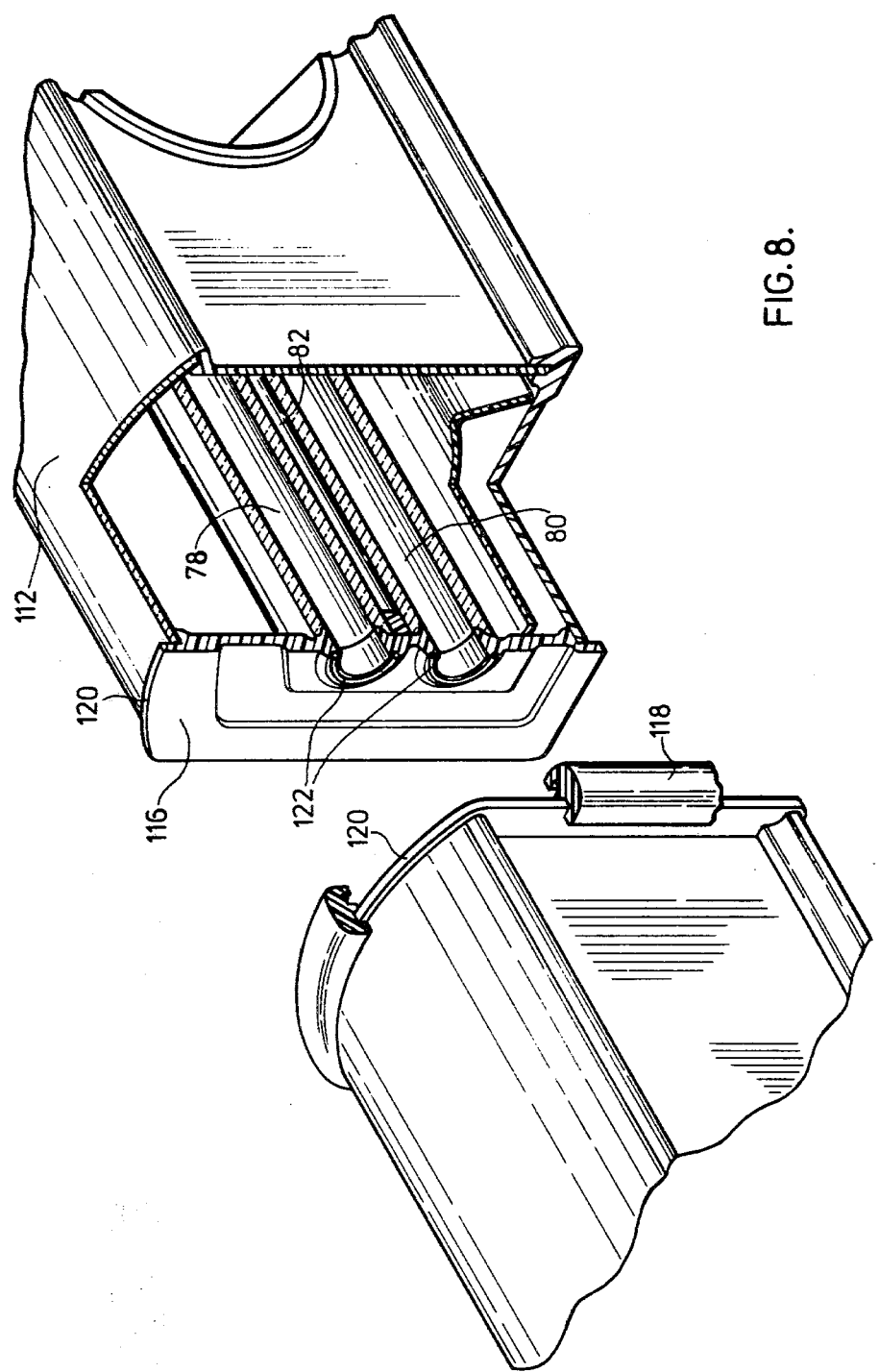
FIG. 8 is a perspective part-sectional and exploded view of the join between two manifold sections structured as shown in FIG. 7.
Figure 9:
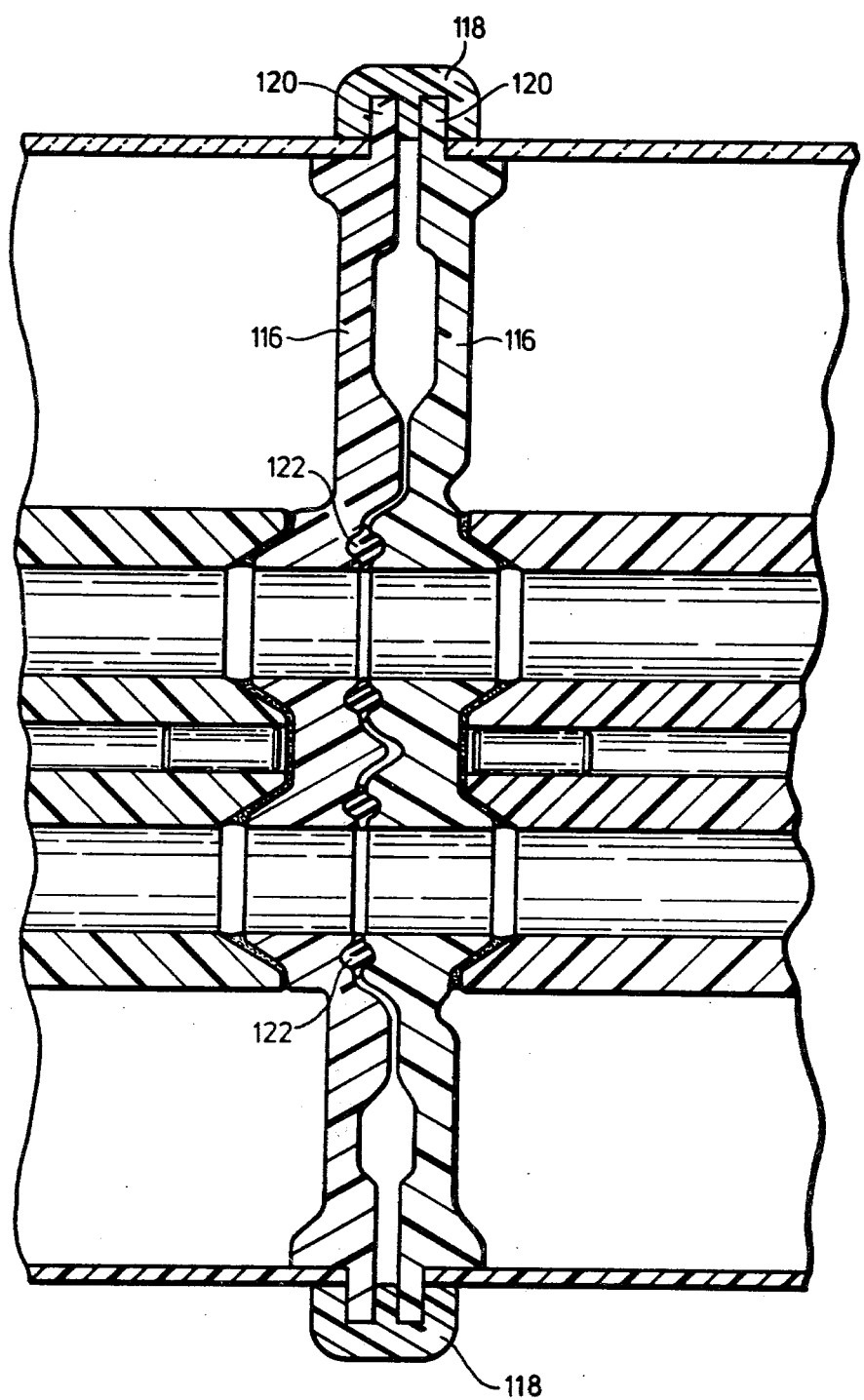
FIG. 9 is a sectional view of the exploded join of FIG. 8 in assembled relation.

FIGS. 8 and 9 illustrate the joining of two manifold units of the type shown in FIG. 7. End closure walls 116 are arranged to abut each other, as shown in FIG. 9, and an outer sealing bead 118 engages projections 120 provided on the walls 116 to connect and seal the two parts together. The ends of the flow channels 78 and 80 abut each other and sealing O-rings 122 are provided to ensure a fluid tight connection.

Figure 10:
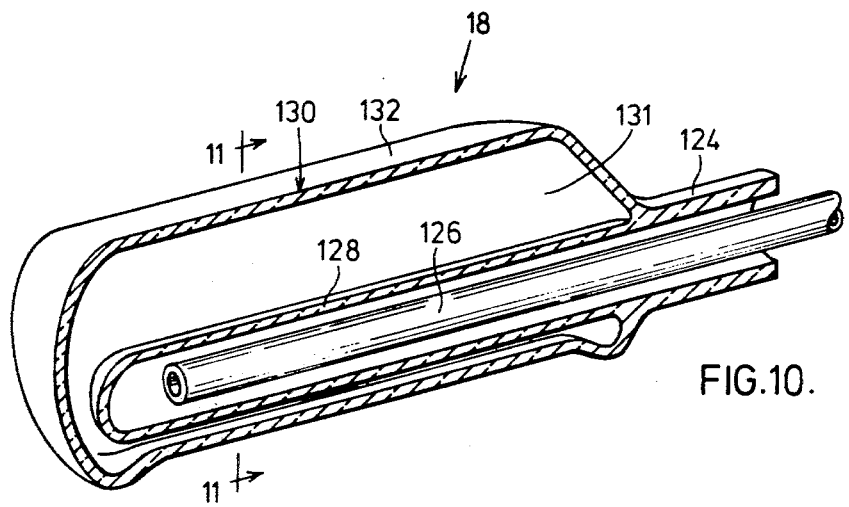
FIG. 10 is a perspective sectional view of an alternative solar collector in accordance with this invention.
Figure 11:
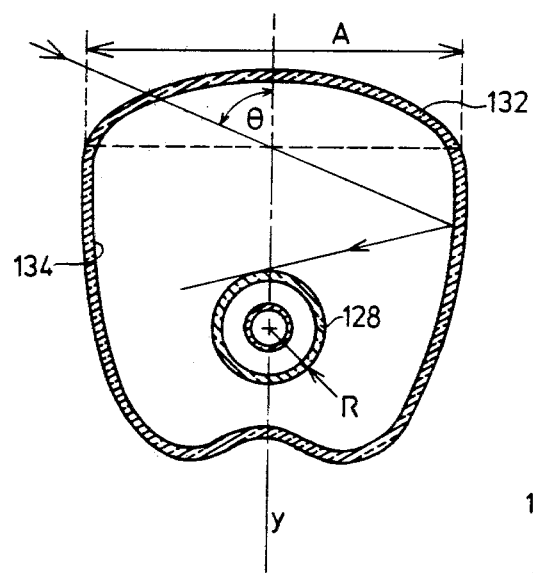
FIG. 11 is a sectional view taken on line 11—11 of FIG. 10.
Figure 12:
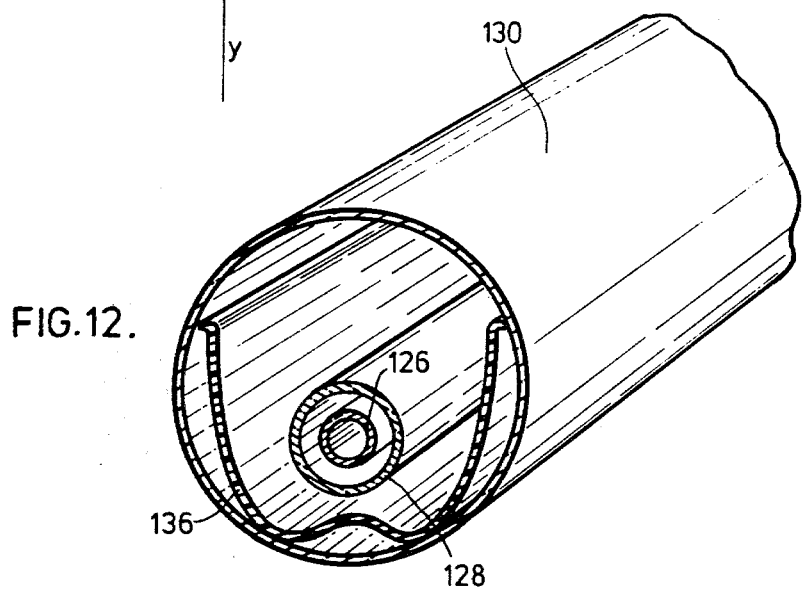
FIG. 12 is a sectional view of a modification to the solar collector of FIG. 10.

In FIGS. 10 to 12, there are illustrated further alternative embodiments of the invention. The collectors 18 in FIGS. 10 and 11 are in the form of an elongate, integral generally tubular element, preferably fabricated wholly of glass or other convenient material, having a tubular end portion 124.

A tube 126 extends generally axially of the collector 18 and the portion of the tube 126 extending into the collector 18 beyond the tubular end portion 124 is surrounded by an axially extending parallel tubular portion 128 integral with and of the same diameter as the tubular end portion 124 at one end and closed at the other beyond the extremity of the tube 126 to define a fluid flow path through the collector 18 in analogous manner to the tube 62 in the embodiment of FIGS. 4 to 6. The fluid flow path extends internally of the tube 126 and then between the internal surface of the tubular portion 128 and the outer surface of the tube 126, or vice versa, depending on the direction of fluid flow.

An outer envelope 130 surrounds and encloses the tube 126 and the tubular portion 128 and is integral with the tubular end portion 124. The space 131 between the outer envelope 130 and the tubular portion 128 is evacuated.

The outer envelope 130 is contoured as shown in the sectional view of FIG. 11 and in the same manner as the body enclosure 48 of the collector 18 of FIGSS. 4 to 6, for reasons discussed in more detail below, and has a relatively flat top surface portion 132 to allow entry of sun rays into the collector 18. If desired, the top surface portion 132 and the cover member 46 in FIGS. 4 to 6 may be in the form of an optical element.

The remainder of the inner surface of the outer envelope 130 is coated with a highly reflective material 134, such as silver, to reflect sun rays entering the collector 18 through the top surface 132 and impinging on the envelope inner surface.

The tubular portion 128 has a high absorbance at all incident angles in the spectral wavelength of $3 \times 10^{-7}$ $3 \times 10^{-6}$ meters. In order to decrease heat losses, the absorbance for higher wavelengths should be low. The selective absorbance may be achieved by coating the outer surface of the tubular portion 128 with a suitable material, such as chrome black. The circular cross section of tube 128 and also that of tube 62 in FIGS. 4 to 6 may be replaced by any other desired cross-sectional shape.

In the alternative construction of FIG. 12, the outer envelope 130 has a generally circular cross-section. In place of the internal reflective surface 134, there is provided a contoured reflector 136 of the required cross-sectional shape to achieve the same concentrating effect as the reflective surface 134 in FIGS. 10 and 11.

Figure 13:
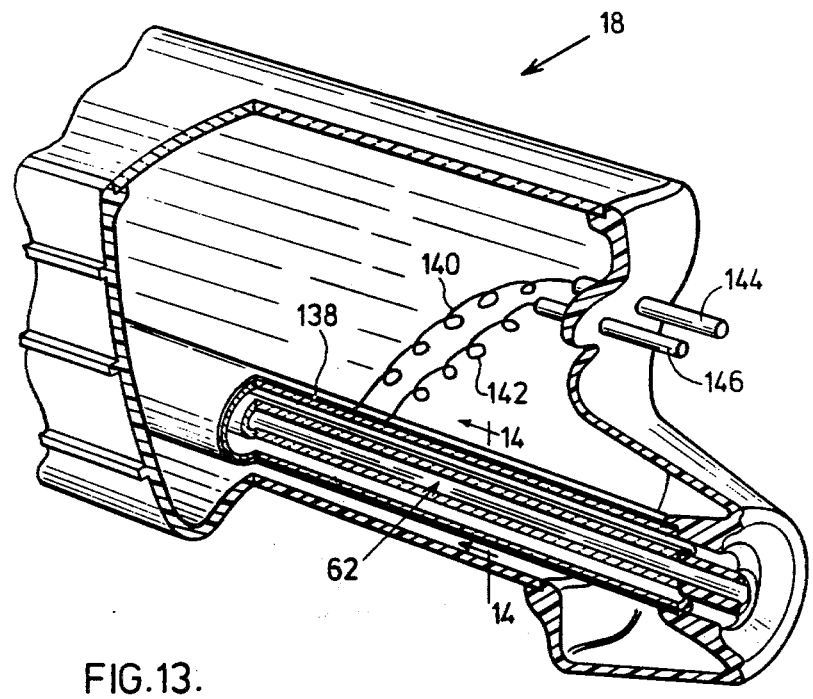
FIG. 13 is a perspective part-sectional view of a modification of the solar collector of FIGS. 4 to 6.
Figure 14:
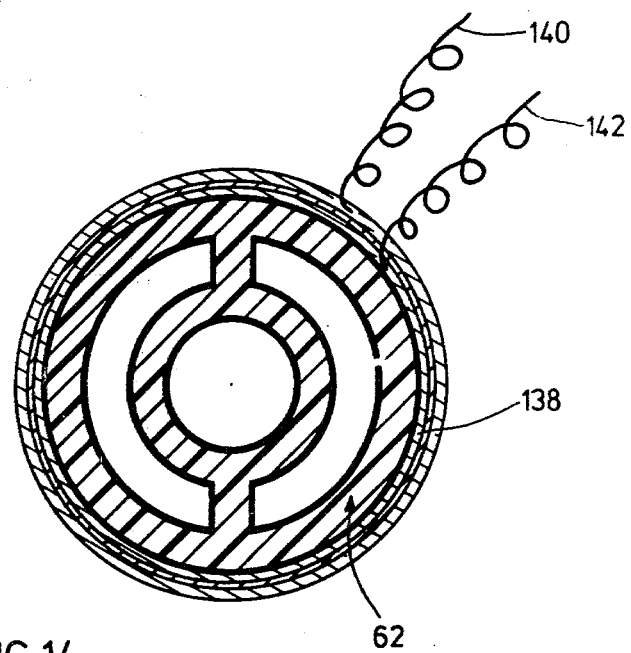
FIG. 14 is a sectional view taken on line 14—14 of FIG. 13.
Figure 15:
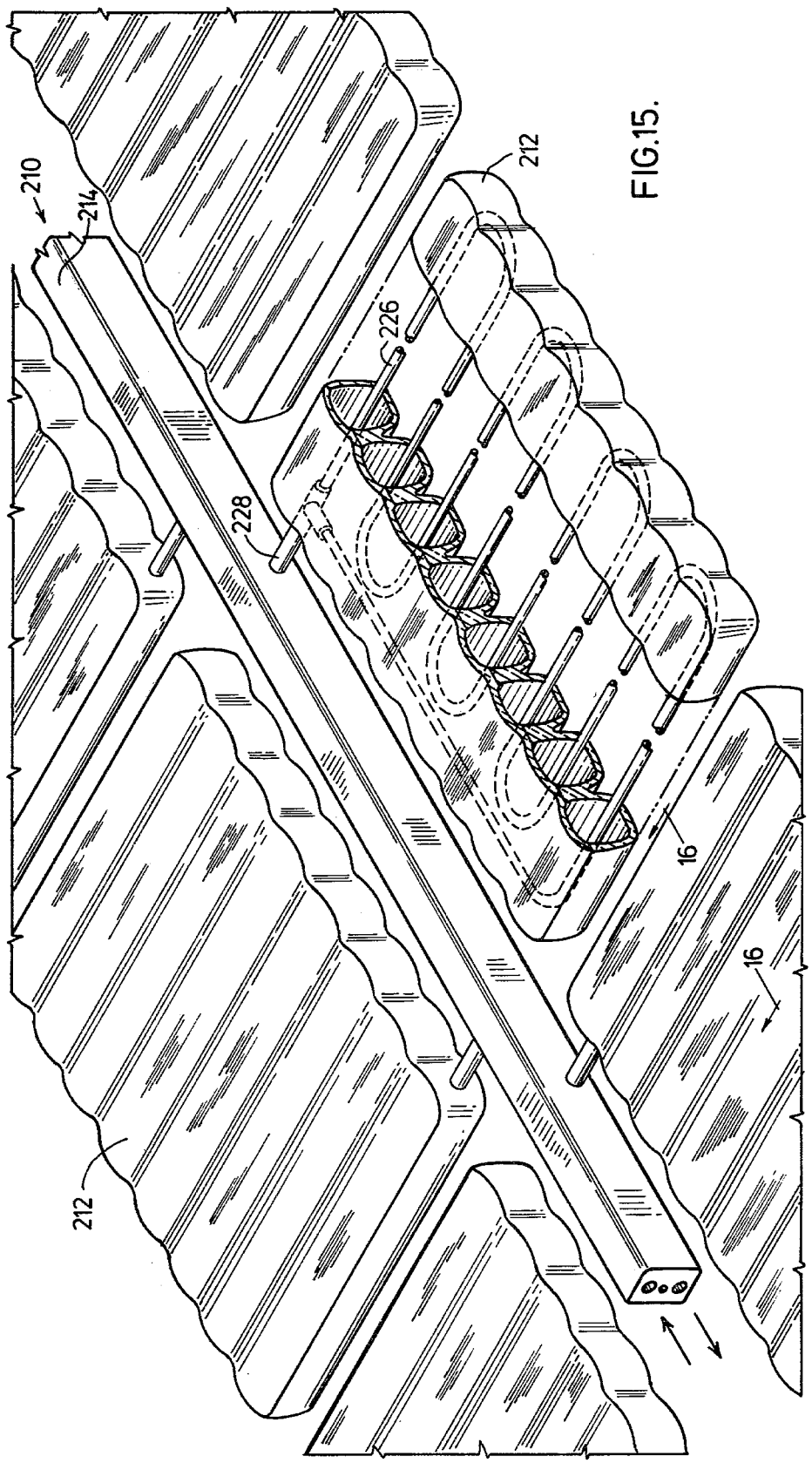
FIG. 15 is a perspective view with parts broken away for clarity of a solar energy collection system comprising a single central manifold and a plurality of collector modules provided on opposite sides of the central manifold in accordance with a further embodiment of the invention.
Figure 16:
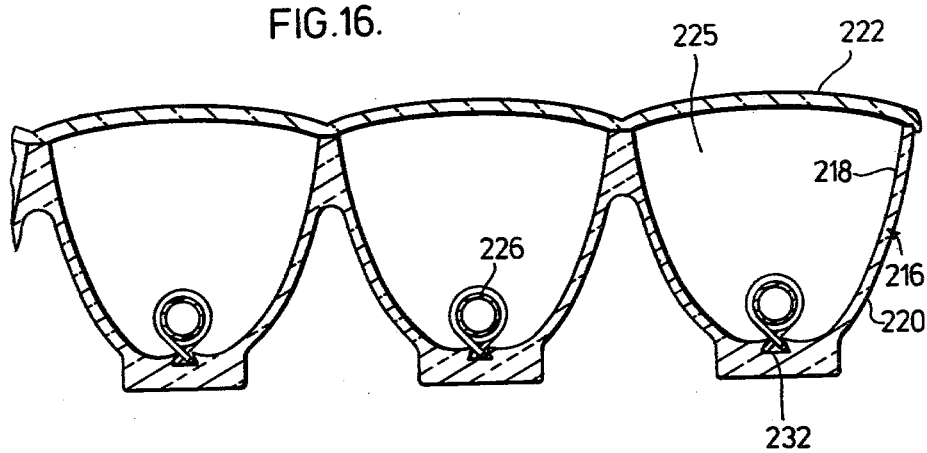
FIG. 16 is a section taken on line 16—16 of FIG. 15.

Turning now to FIGS. 13 and 14, there is shown a modification in which the collector 18 also achieves a photo-voltaic function by producing an electrical output from the collected solar energy. This is achieved by coating the tube 62 with light-energy actuable electricity generating material layers 138 which communicate through wires 140 and 142 to terminals 144 and 146 extending through the wall of the collector 18.

Turning now to FIGS. 15 to 21, these Figures illustrate a further and presently preferred embodiment of the invention which is an improvement upon those illustrated in FIGS. 1 to 14 and employs a plurality of energy collection modules.

Referring to FIGS. 15 to 21, a solar energy collection system 210 comprises a plurality of collector modules 212 connected to a central elongate manifold 214.

The collector modules 212 and the elongate manifold 214 may be supported on a suitable support structure, such as, a building roof, as illustrated in FIG. 1. The number of modules 212 associated with each manifold 214 may vary widely, as may the number of manifolds 214 provided in a particular heating system.

Each module 212 comprises a plurality of individual collectors 216. The individual collectors 216 have an internal reflector surface 218 formed on a lower body portion 220. The reflector surface 218 may be provided by a thin film of silver or other convenient highly reflective material. The shape of the reflector surface 218 is described in detail below. An upper transparent cover 222 and end caps 224 enclose an evacuated space 225 in each individual collector 216.

The individual collectors 216 are integrally joined together in each module 212 and are comprised of an integrally-formed lower body member made up of body portions 220 and an integrally-formed cover member made up of covers 222. The cover member is sealingly joined to the lower body member. The transverse width of the body portions 220 at their upper extremity is maintained at a low value to minimize the non-light receiving area of the module 212.

The evacuated spaces 225 may be individually evacuated, or more preferably, fluid flow connection is provided between the individual evacuated spaces throughout the module, so that the whole internal volume of the module may be evacuated in a single operation.

The lower body portion 220 preferably is constructed of vitreous ceramic material formed from clay and various fluxes while the cover 222 preferably is constructed of glass. Vitreous ceramic materials are inexpensive and readily available, and can be formed into shaped objects by molding or extrusion, making them ideal for formation of integral molded or extruded lower body portion.

Through the plurality of collectors 216 passes a single fluid flow pipe 226 by which fluid to be heated in the module 212 passes successively through the plurality of collectors from an inlet-outlet pipe 228 which connects the module 212 to the manifold 214. As a result of this arrangement, fluid flows successively in opposite directions in adjacent collectors 216.

The tube 226 is supported at the appropriate location in each of the collectors 216 by sprung wires 228 wound round the tube 226 and having their ends 230 located in elongate grooves 232 formed in the base of the body portion 220. The use of the sprung wires 228 to support the tube 226 also serves to minimize conductive heat losses between the tube 226 and the body portion 220 in each collector 216.

The outer surface of the tube 226 has a coating layer thereon of a material, such as, chrome black, which selectively absorbs energy of a certain wavelength generally about $3\times10^{-7}$ to about $3\times10^{-6}$ meters, while not absorbing other wavelengths. The use of a selectively absorbant material coating in this way minimizes heat losses from the tube 226 through radiation.

Alternatively, at least the outer wall of the tube 226 may be formed of a material which will act as a selective absorber, such as, a black ceramic material.

By utilizing the modular approach illustrated in the drawings, the individual collectors 216 may be diminished in dimension with respect to those described above with respect to FIGS. 1 to 14, so that for the same temperature rise of fluid, the evacuated space per unit area can be considerably decreased. Modules 212 may be formed of any desired number of individual collectors 216 commensurate with the temperature rise desired during passage of fluid therethrough.

The collectors 216 also each may achieve a photovoltaic function by producing an electrical output from collected solar energy. The tube 226 may be coated with light energy actuable electricity generating material layers which communicate through suitable electrical connection to exterior of each collector 216.

Figure 20:
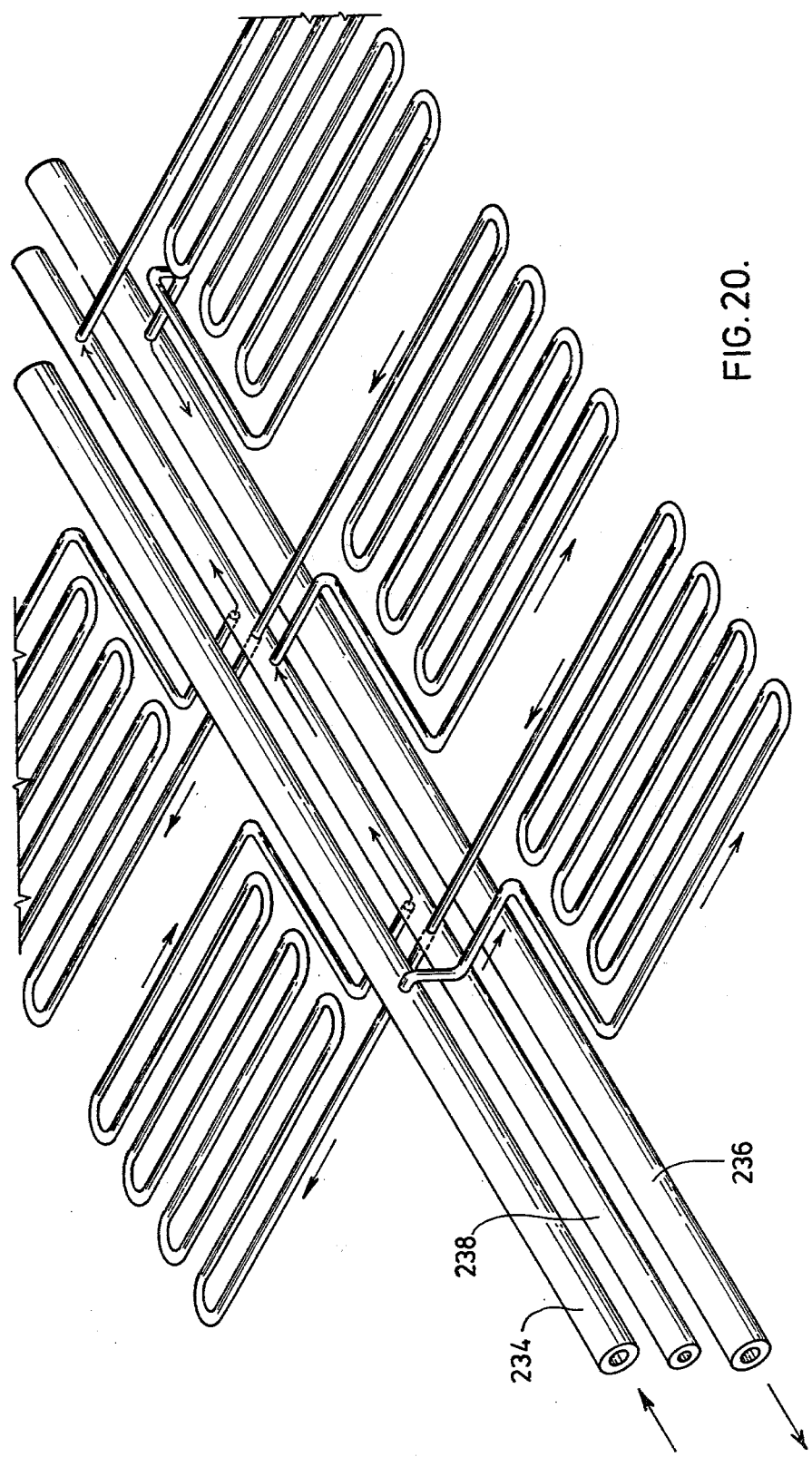
FIGS. 20 and 21 are perspective views of two alternate fluid flow arrangements through the modular collectors.
Figure 21:
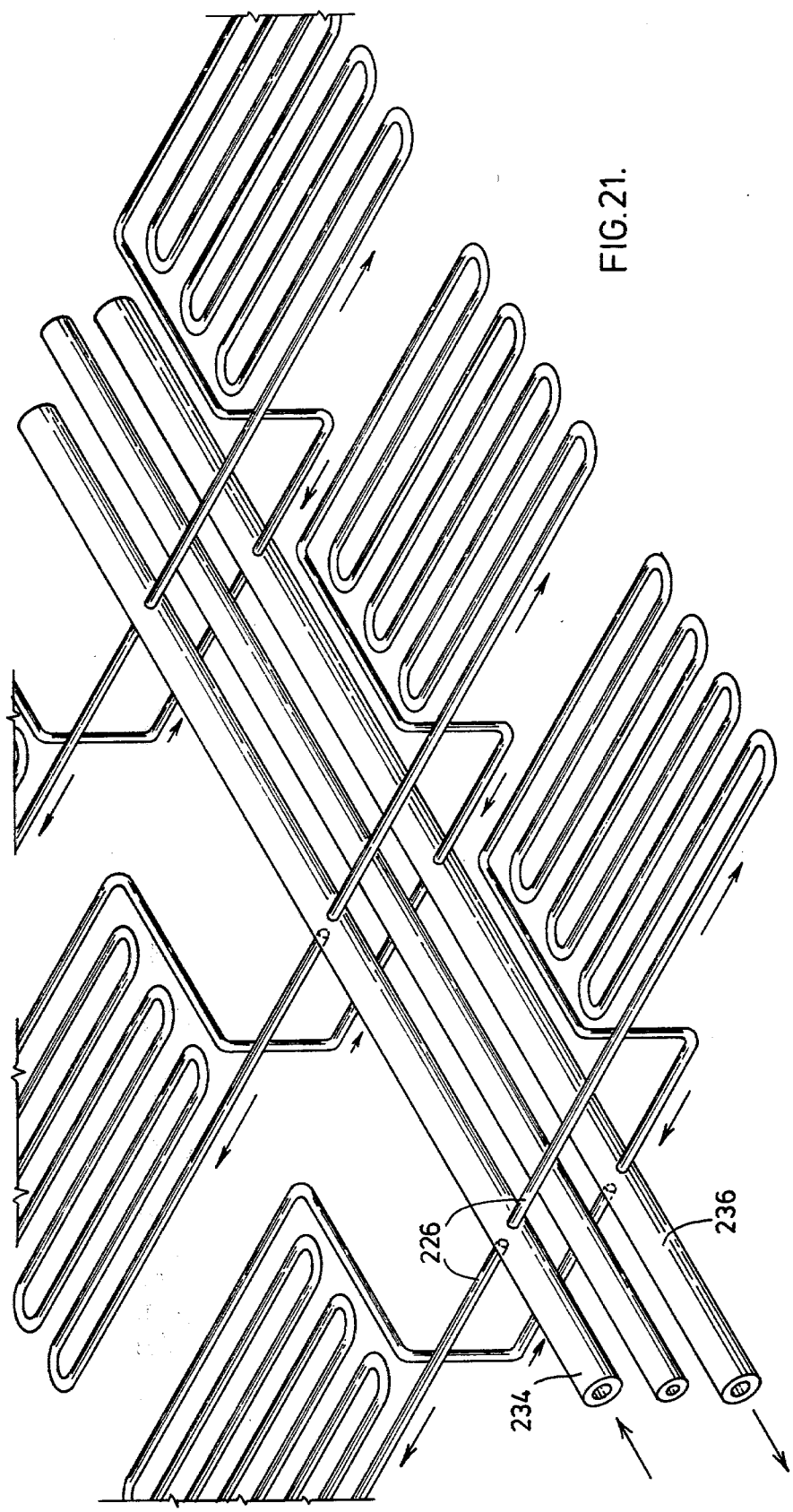

FIGS. 20 and 21 illustrate two alternative flow patterns with respect to the plurality of modules 212. In the embodiment of FIG. 20, the manifold 214 has an inlet pipe 234 for the passage of fluid to be heated, such as, air, water or other convenient fluid from one end of the manifold to the other, and an outlet pipe 236 for receipt of heated fluid. The inlet pipe 234 feeds each of the modules 212 in parallel and the outlet pipe 236 receives heated fluid from each of the modules 212 in parallel.

In the embodiment of FIG. 21, inlet and outlet tubes 234 and 236 are again provided, but in this case a central pipe 238 also is utilized. Fluid to be heated passes in parallel to groups of modules 212 and fluid passes in series through each member of the group of modules, as illustrated. Heated fluid passes in parallel from the groups of modules.

Referring generally to the illustrated collectors, there are two important parameters of any collector, namely, "concentration ratio" (C) and the "acceptance angle" ($\theta$). These parameters are determined by the dimensioning and cross-sectional shape of the collector.

The concentration ratio (C) refers to the relative dimensions of the radiation-receiving portion and radiation aborbing portion of the collector, while the acceptance angle ($\theta$) refers to the angle within which all rays entering the collector through the radiation-receiving portion are absorbed by the radiation-absorbing portion of the collector while rays entering the collector through the radiation-receiving portion outside that angle are reflected.

Figure 17:
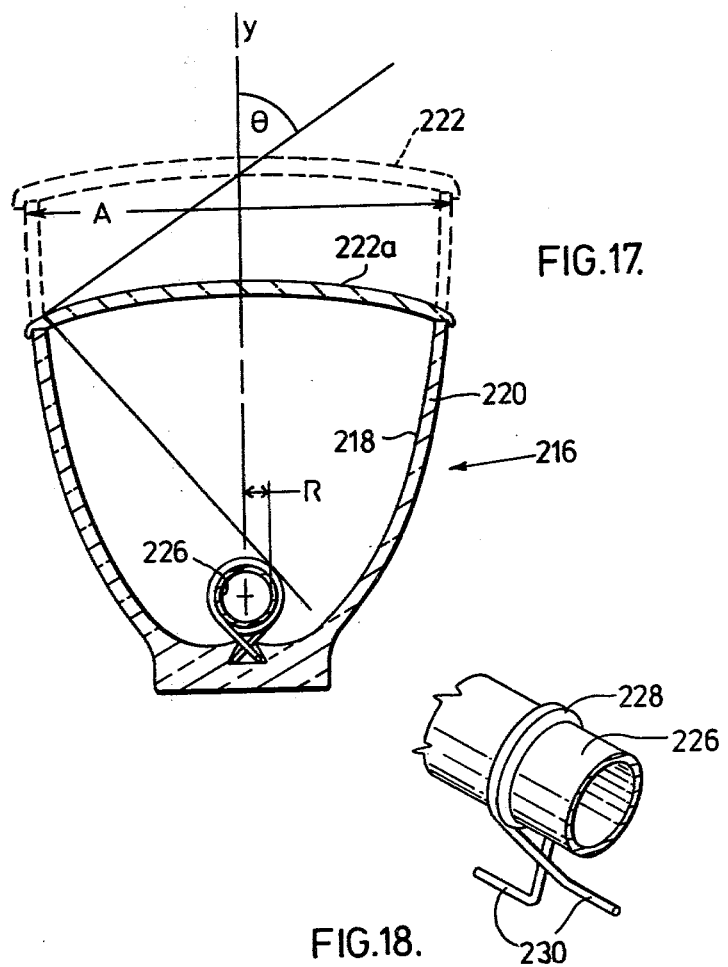
FIG. 17 is a sectional view similar to FIG. 2 of a modified form of collector.
Figure 18:
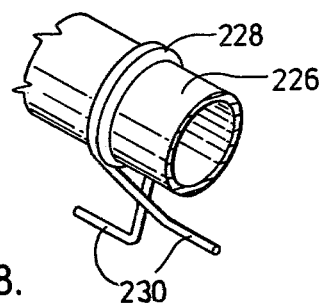
FIG. 18 is a perspective view of a detail of the collector.
Figure 19:
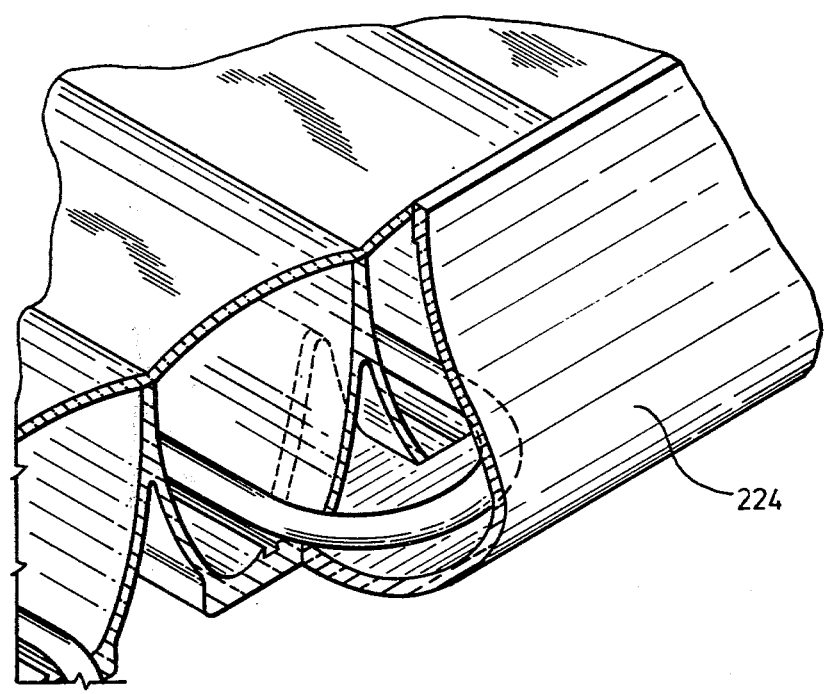
FIG. 19 is a close up detail of another portion of the collector.

Referring to FIGS. 11 and 17, the concentration ratio (C) of the collectors 18 and 216 is determined by the ratio:

$$C = \frac{\text{Entrance Aperture Width}}{\text{Absorber Tube Circumference}} = \frac{A}{2\pi R}$$

The acceptance angle ($\theta$) is the angle to the axis ($\gamma$) within which all rays entering the respective collector 18 or 216 through the upper surface 46, 132 or 222 are absorbed by tube 62, 128 or 226 while rays outside that angle are reflected back without being absorbed. The limiting condition for acceptance of rays for absorption is a ray which is reflected by the reflecting surface 50, 134 or 218 to pass tangentially to the tube 62, 128 or 226, as illustrated.

In a collector 18 or 216 of maximum efficiency, the acceptance angle ($\theta$) is determined by the concentration ratio (C), in accordance with the equation:

$$C = 1/\sin\theta$$

and the locus of the reflecting surface 50, 134 or 218 of the collector 18 or 216 is the shape corresponding to that equation.

It will be seen from the above equations that, as the concentration ratio (C) increases, the acceptance angle ($\theta$) decreases. The value of the acceptance angle will determine the length of time during a given day when the collector 18 or 216 will absorb light rays, assuming that the collector 18 or 216 is located in a fixed relationship with respect to the sun movement. The value of the concentration ratio will determine the temperature rise attainable in the tube 62 or 226 during the time that rays are accepted within the acceptance angle, with an increase in concentration ratio leading to an increase in temperature under otherwise fixed conditions.

The minimum concentration ratio is about 0.5 and the upper limit of concentration ratio for a fixed location system is about 10. If the collector 18 or collector module 212 is mounted to track the sun's movement on a daily basis or if the sun's rays can be concentrated within the narrow acceptance angle which exists at these high concentration ratios, then the concentration ratio may exceed 10, although it will rarely exceed 50.

Preferably, the concentration ratio is about 1.0 to about 3.0, most preferably about 1.5 to about 2.0, which provides a good balance of acceptance angle and concentration ratio, so that the collector 18 or 216 has a sufficiently wide acceptance angle to absorb rays over a long period of daylight hours, while at the same time providing a good heating effect on the fluid flowing through the collector 18 or 216.

If the physical height of the body portion 48, 132 or 220 is decreased without otherwise altering the shape of the reflector, as shown in the modification of FIG. 17 wherein the dotted outline represents the locus at maximum efficiency and the solid outline with cover 222a represents the decreased height body, the concentration ratio is decreased and this leads to a less than maximum efficiency of collector 18 or 216. Since, however, the upper portion of the reflecting surface 50, 134 or 218 adjacent the upper surface 46, 132 or 222 is almost parallel and has only a minor effect on the rays which are absorbed by the tube 62, 128 or 226, the loss of efficiency need only be minor, while the material saving achieved thereby may be considerable.

Generally, when the truncated form of body 48, 132 or 220 is adopted, the concentration ratio (C) is always maintained greater than about 0.5. The maximum loss of efficiency from ideal conditions is about 25%, while preferably the loss of efficiency tolerated on truncation is less than about 10%.

SUMMARY

The present invention, therefore, provides a solar energy collection system which is highly efficient, inexpensive to manufacture and assemble and which is easy to maintain and replace broken elements. Modifications are possible within the scope of this invention.

What I claim is:

1. A solar collector comprising:
   an outer evacuated elongate envelope having an upper transparent surface to admit light rays to the envelope,
   a tube extending in the envelope from one end thereof towards the other for conveying fluid to be heated into the collector and for removing heated fluid from the collector,
   a selectively absorbing surface on said tube for selectively absorbing energy having predetermined wavelengths and rejecting other wavelengths, and
   an elongate reflector surface located internally of the envelope and arranged to reflect light received through the transparent surface onto said tube,
   said upper transparent surface and said tube being dimensioned to provide a concentration ratio which is the ratio of the transverse width of the upper transparent surface to the outer circumference of the tube and has a value from about 1 to about 50,
   said reflector surface having mirror image cross-sectional-shaped portions on either side of a vertical axis of the reflector surface each having a length required to ensure that no less than about 75% of the maximum efficiency of the collector is realized,
   said maximum efficiency being provided by the shape of said reflector surface required to ensure that all incident rays received into the envelope through the upper transparent surface within the acceptance angle $\theta$ subtended to said vertical axis and determined by the equation:

$$C = 1/\sin \theta$$

where C is the concentration ratio and $\theta$ is the acceptance angle, are concentrated on said tube while rays outside the acceptance angle are reflected.

2. The solar collector of claim 1 wherein said outer envelope is comprised of an upper surface portion constituting said transparent surface integrally joined to a lower body portion.

3. The solar collector of claim 2 wherein said upper surface portion is formed of glass and said lower body portion is formed of vitreous ceramic material.

4. The solar collector of claim 3, wherein said lower body portion has a cross-sectional shape which is that of the reflecting surface and said reflecting surface is formed on the internal surface of said body member.

5. The solar collector of claim 1, wherein said tube comprises a concentrically-arranged pair of inner and outer tubes extending from one end of the envelope substantially to the other and an end closure at the other end constructed to define a flow channel from the inner to the outer tube or vice versa, whereby fluid to be heated enters the collector from the same end as heated fluid is removed from the collector.

6. The collector of claim 1 wherein said reflector surface locus is in the shape required to ensure that no less than about 90% of the maximum efficiency of the collector is realized.

7. The collector of claim 1 wherein said concentration ratio has a value of about 1.0 to about 3.0.

8. The collector of claim 1, wherein said tube has light-energy actuable electricity generating material layers provided thereon and electrical connectors extending from said layers externally of the envelope.

9. A solar energy collection system, comprising:
   an elongate manifold through which flows fluid to be heated and heated fluid,
   a first plurality of solar collectors extending from one side of said manifold generally perpendicularly thereto, and
   a second plurality of solar collectors extending from the other side of said manifold perpendicularly thereto,
   each of said solar collectors being constructed as defined in claim 1.

10. A solar energy collecting structure comprising:
    a substantially planar surface arranged at an angle to the ground of about 10° greater than the latitude of location of the surface and oriented to face approximately due south,
    a plurality of the solar collection systems defined in claim 9 located on the side of said planar surface facing due south with said manifolds located substantially parallel to each other and perpendicular to the upper and lower edges of the surface and said solar collectors extend parallel to said latter edges, and
    a single feed and return pipe communicating in parallel with each of said manifolds from the other side of said planar surface to provide a common fluid feed thereto and a common fluid collection therefrom.

11. The system of claim 9, including a plurality of flow channels through said manifold and said solar collectors which establishes a parallel flow of fluid to be heated to a plurality of sets of said collectors, a parallel flow of heated fluid from the plurality of sets of collectors and a series flow of fluid through each set of said collectors.

12. The system of claim 11, wherein said manifold includes an elongate member having upper and lower continuous bores formed therethrough to provide said fluid inlet and outlet channels and a central bore separated into individual segments corresponding to the individual members of said plurality of sets and providing part of said series flow path.

13. The system of claim 11, wherein at each end of each of said individual segments of said central bore, the inner flow path portions of said tube are fluidly interconnected by a sleeve extending transversely of the central bore and preventing fluid flow therepast through the central bore.

14. The system of claim 10, wherein said elongate member is surrounded by heat insulating material to minimize heat loss from heated fluid passing through said elongate member.

15. The system of claim 12 wherein said elongate member is located in an elongate evacuated chamber.

16. The system of claim 15, wherein said evacuated chamber has an upper transparent surface, generally parallel upright side walls and a reflector surface located internally of the chamber to reflect light received through said upper transparent surface onto said elongate member.

17. The system of claim 12, wherein said mainfold has conical shape openings on each side thereof arranged in pairs, each of said collectors has a conical end and the conical ends of the collectors are sealingly received in the conical openings.

18. A modular solar collector, comprising
a plurality of parallel elongate envelopes physically joined together in a fixed immovable relationship to each other in a module, each said envelope having an upper transparent surface to admit light rays to the envelope,
a tube extending in each envelope from one end to the other for conveying fluid to be heated into each collector and for removing heated fluid from the collector,
a selectively absorbing surface on said tube for selectively absorbing energy having predetermined wavelengths and rejecting other wavelengths, and
an elongate reflector surface located internally of each said envelope and arranged to reflect light received through the transparent surface onto said tube,
said upper transparent surface and said tube being dimensioned to provide a concentration ratio in each envelope which is the ratio of the transverse width of the upper transparent surface to the outer circumference of the tube and has a value from about 1 to about 50,
said reflector surface having mirror image cross-sectional-shaped portions on either side of a vertical axis of the reflector surface each having a length required to ensure that no less than about 75% of the maximum efficiency of the collector is realized,
said maximum efficiency being provided by the shape of said reflector surface required to ensure that all incident rays received into the envelope through the upper transparent surface within the acceptance angle $\theta$ subtended to said vertical axis and determined by the equation:

$$C = 1/\sin \theta$$

where C is the concentration ratio and $\theta$ is the acceptance angle, are concentrated on said tube while rays outside the acceptance angle are reflected.

19. The collector of claim 18 wherein said reflector locus is the shape required to ensure that no less than about 90% of the maximum efficiency of the collector is realized.

20. The collector of claim 18 wherein said concentration ratio has a value of about 1.0 to about 3.0.

21. The collector of claim 20 wherein said concentration ratio has a value of about 1.5 to about 2.0.

22. The collector of claim 18 wherein said plurality of parallel elongate envelopes is provided by an integrally-formed lower body member and an integrally-formed transparent cover member which is joined in vacuum sealing relationship with said body member.

23. The collector of claim 22 wherein said body member is formed of vitreous ceramic material and said cover member is formed of glass.

24. The collector of claim 23 wherein said reflector surface in each said envelope is formed on the internal surface thereof.

25. The collector of claim 22 wherein said tube passes in continuous manner from one end of said module to the other in alternate direction in each adjacent envelope and said tube is supported in minimal heat conducting relationship with said body member.

26. The collector of claim 25 wherein a groove is provided at the bottom of each envelope and springs surrounding the tube and seated in said groove provide said tube support.

27. The collector of claim 18 wherein said tube has light-energy actuable electricity generating material layers provided thereon and electrical connectors extending from said layers externally of the envelope.

* * * * *